(12) United States Patent
Tanaka et al.

(10) Patent No.: US 8,119,023 B2
(45) Date of Patent: Feb. 21, 2012

(54) PIEZOELECTRIC/ELECTROSTRICTIVE CERAMIC COMPOSITION MANUFACTURING METHOD

(75) Inventors: Ritsu Tanaka, Nagoya (JP); Hirofumi Yamaguchi, Komaki (JP); Yukinobu Yura, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 449 days.

(21) Appl. No.: 12/399,335

(22) Filed: Mar. 6, 2009

(65) Prior Publication Data

US 2009/0236556 A1 Sep. 24, 2009

(30) Foreign Application Priority Data

Mar. 21, 2008 (JP) ................... 2008-073997
Jan. 27, 2009 (JP) ................... 2009-015440

(51) Int. Cl.
*H01L 41/187* (2006.01)
(52) U.S. Cl. .................. 252/62.9 R; 501/134
(58) Field of Classification Search .............. 501/134; 252/62.9 R
See application file for complete search history.

(56) References Cited

U.S. PATENT DOCUMENTS

| 6,083,415 | A  | * | 7/2000 | Kimura et al. | ............ 252/62.9 R |
| 7,911,117 | B2 | * | 3/2011 | Yamaguchi et al. | .......... 310/357 |
| 2007/0001553 | A1 | * | 1/2007 | Kawada et al. | ............... 310/358 |

FOREIGN PATENT DOCUMENTS

JP 2005-281013 A1 10/2005

* cited by examiner

*Primary Examiner* — Carol M Koslow
(74) *Attorney, Agent, or Firm* — Burr & Brown

(57) ABSTRACT

A (Li, Na, K)(Nb, Ta)$O_3$-based piezoelectric/electrostrictive ceramic composition having a large field-induced distortion during application of a high electric field is provided. After synthesizing a perovskite oxide containing Li (lithium), Na (sodium) and K (potassium) as A-site elements and containing at least Nb (niobium) out of the Nb and Ta (tantalum) as B-site elements, a ratio of total number of atoms of the A-site elements to total number of atoms of the B-site elements being higher than 1, a Bi (bismuth) compound is added to the perovskite oxide and the perovskite oxide is reacted with the Bi compound. An addition amount of the Bi compound with respect to 100 molar parts of the perovskite oxide is preferably equal to or greater than 0.01 molar part and equal to or smaller than 0.1 molar part in terms of Bi atoms.

4 Claims, 9 Drawing Sheets

F I G. 1
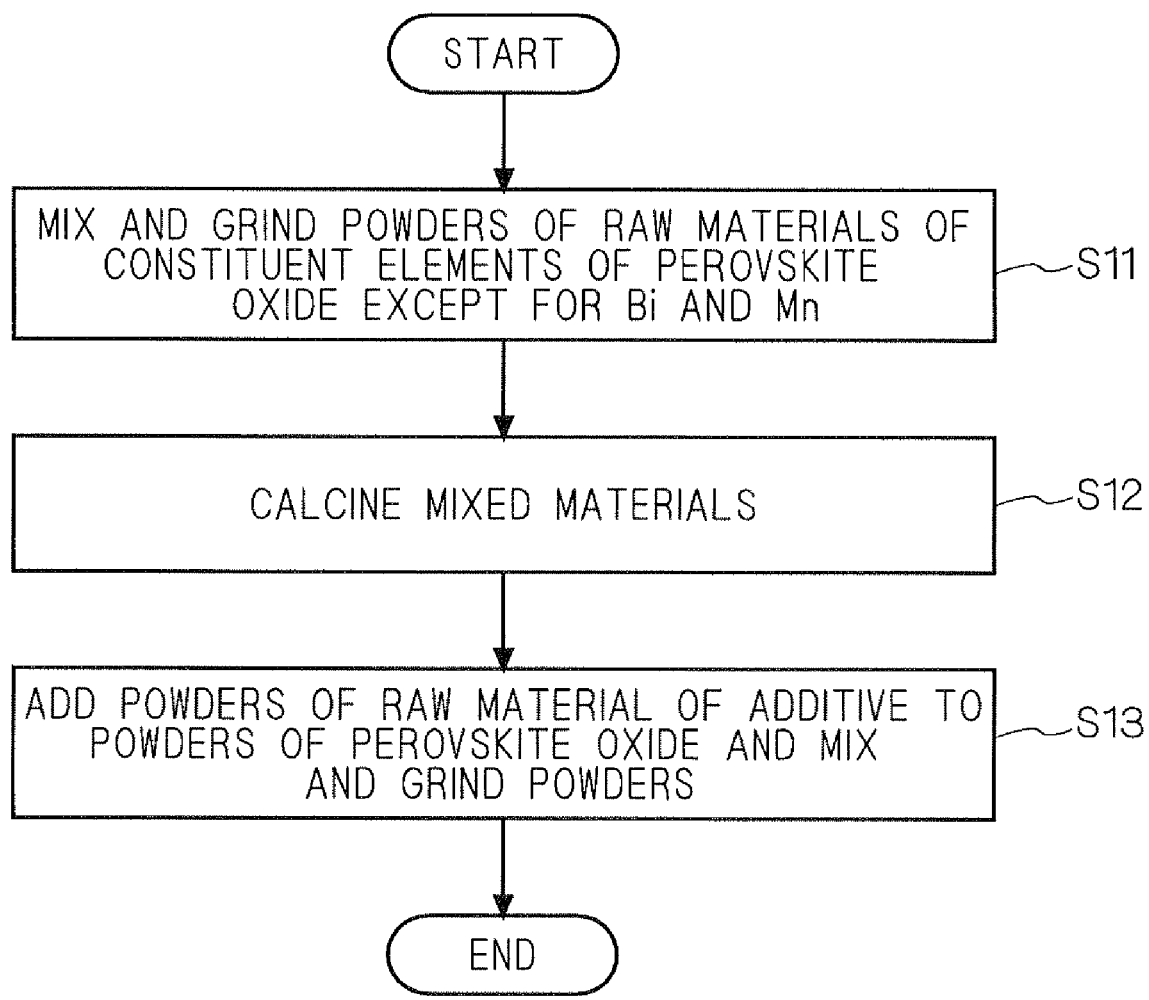

F I G . 4
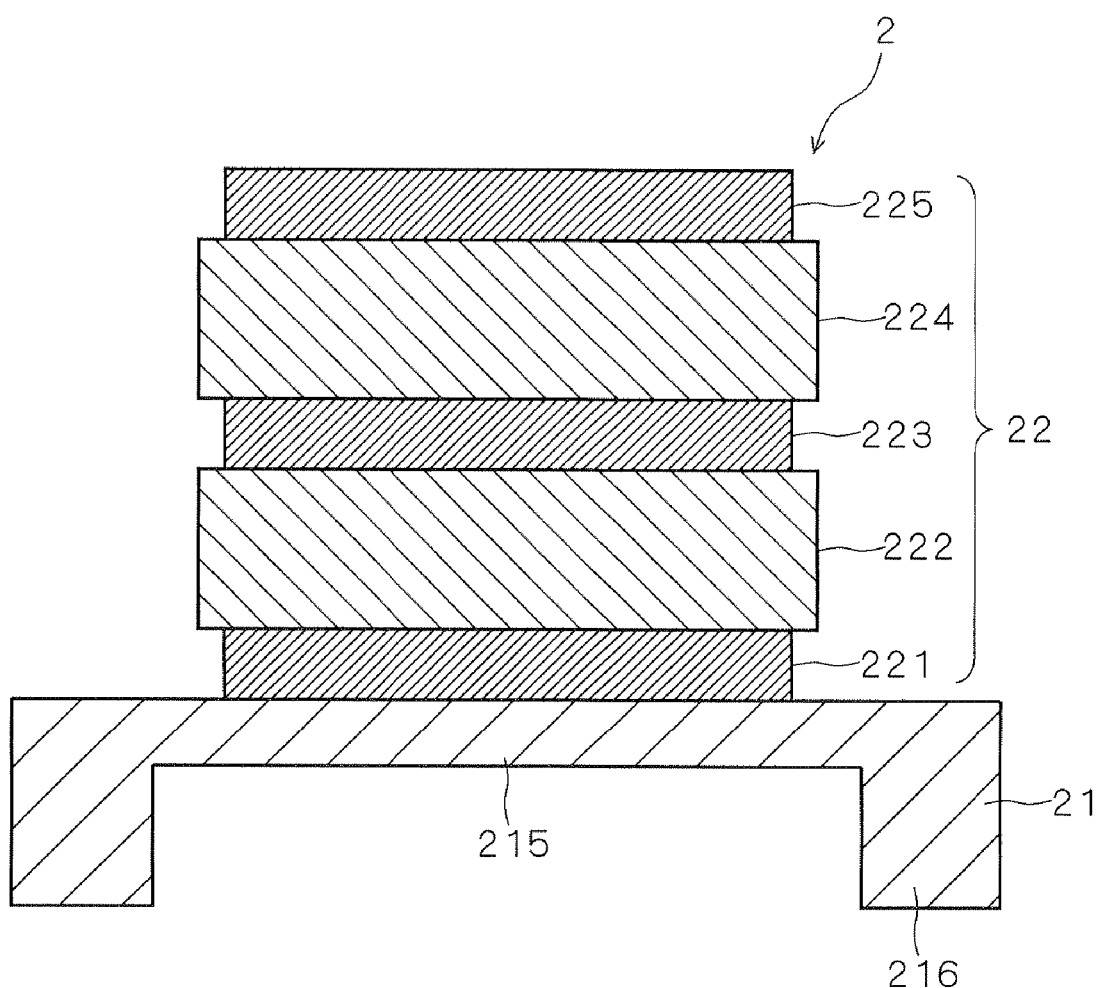

PIEZOELECTRIC/ELECTROSTRICTIVE CERAMIC COMPOSITION MANUFACTURING METHOD

BACKGROUND OF THE INVENTION

1. Field of the Invention

The present invention relates to a method of manufacturing a piezoelectric/electrostrictive ceramic composition.

2. Description of the Background Art

A piezoelectric/electrostrictive actuator can advantageously control a displacement in the order of submicrons with high accuracy. A piezoelectric/electrostrictive actuator using a sintered body of a piezoelectric/electrostrictive ceramic composition as a piezoelectric/electrostrictive body, in particular, has the advantages of high electro-mechanical conversion efficiency, high generation power, high response speed, high durability and low power consumption in addition to accurate displacement controllability. The piezoelectric/electrostrictive actuator, having the advantage of these characteristic features, can be adopted for use in a head of an inkjet printer or an injector of a diesel engine.

As a piezoelectric/electrostrictive composition for the piezoelectric/electrostrictive actuator, a Pb (Zr, Ti)$O_3$(PZT)-based piezoelectric/electrostrictive composition has been conventionally used. Since concern for an influence of elution of lead from the sintered body into the global environment is mounting, use of a (Li, Na, K)(Nb, Ta)$O_3$-based piezoelectric/electrostrictive composition has been considered.

It is, therefore, an object of the present invention to provide a (Li, Na, K)(Nb, Ta)$O_3$-based piezoelectric/electrostrictive ceramic composition having a large field-induced distortion during application of high electric field.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a flowchart showing a flow of manufacturing ceramic powder of a piezoelectric/electrostrictive ceramic composition.

FIG. 4 is a cross-sectional view of a multilayer piezoelectric/electrostrictive actuator.

DETAILED DESCRIPTION OF THE INVENTION

Figure 2:
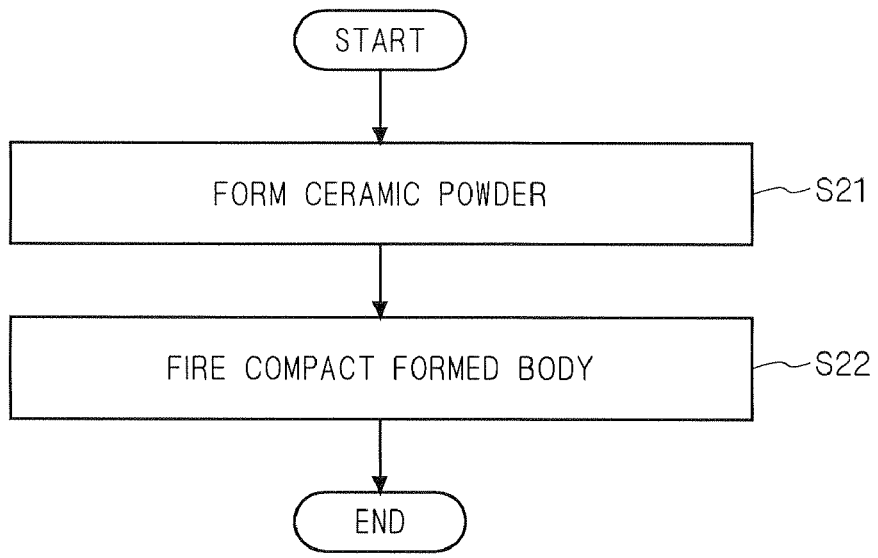
FIG. 2 is a flowchart showing a flow of manufacturing a ceramic sintered body.

A piezoelectric/electrostrictive ceramic composition according to preferred embodiments of the present invention will be described and an actuator using the piezoelectric/electrostrictive ceramic composition will be then described hereinafter. It is to be noted, however, that the following description is not intended to limit use of the piezoelectric/electrostrictive ceramic composition to an actuator. The piezoelectric/electrostrictive ceramic composition may be used in a piezoelectric/electrostrictive element such as a sensor.

<1 Piezoelectric/Electrostrictive Ceramic Composition>
{Composition}

A piezoelectric/electrostrictive ceramic composition according to a preferred embodiment of the present invention is a (Li, Na, K)(Nb, Ta)$O_3$-based piezoelectric/electrostrictive ceramic composition obtained by adding a Bi (bismuth) compound to an perovskite oxide that contains, as A-site elements, Li (lithium), Na (sodium) and K (potassium) and, as B-site elements, at least Nb (niobium) out of Nb and Ta (tantalum), wherein the A-site elements are exceeding the B-site elements.

A composition of the perovskite oxide that is a main component is preferably an alkali niobate represented by a general formula of $\{Li_y(Na_{1-x}K_x)_{1-y}\}_a(Nb_{1-z}Ta_z)O_3$. It is also preferable that a, x, y and z satisfy $1 < a \leq 1.05$, $0.30 \leq x \leq 0.70$, $0.02 \leq y \leq 0.10$ and $0.0 \leq z \leq 0.5$, respectively. If the composition of the perovskite oxide is within these ranges, a field-induced distortion during application of a high electric field can be improved.

It is preferable to use an oxide such as $Bi_2O_3$ (bismuth oxide) as the Bi compound. Alternatively, a carbonate such as $Bi_2(CO_3)_3$ (bismuth carbonate), a hydroxide such as $Bi(OH)_3$ (bismuth hydroxide), an organic acid salt such as $Bi_2(C_4H_4O_6)_3$ (bismuth tartrate) or an alkoxide such as $Bi(OC_2H_5)_3$ (triethoxybismuth) that turns into an oxide when reacting with the perovskite oxide can be used as the Bi compound.

An addition (i.e., added) amount of the Bi compound relative to 100 molar parts of the perovskite oxide is preferably equal to or greater than 0.01 molar part, and equal to or smaller than 0.1 molar part in terms of Bi atoms. If the addition amount of the Bi compound is within this range, the field-induced distortion during the application of a high electric field can be improved.

It is further preferable to add an Mn (manganese) compound to the perovskite oxide. If the Mn compound is added to the perovskite oxide, the field-induced distortion during application of a high electric field can be improved. If the Mn compound is added to the perovskite oxide in which the A-site elements exceed the B-site elements as stated above, a hardening caused by Mn introduction can be prevented. An oxide such as MnO, $MnO_2$ or $Mn_3O_4$ (manganese oxide) can be used as the Mn compound. Alternatively, a carbonate such as $MnCO_3$ (manganese carbonate), a hydroxide such as $Mn(OH)_2$ (manganese hydroxide) or an organic acid salt such as $Mn_2(C_4H_4O_6)_3$ (manganese tartrate) that turns into an oxide when reacting with the perovskite oxide can be used as the Mn compound.

An addition amount of the Mn compound relative to 100 molar parts of the perovskite oxide is preferably equal to or greater than 0.01 molar part, and equal to or smaller than 0.2 molar part in terms of Mn atoms. If the addition amount of the Mn compound is within this range, the field-induced distortion during the application of a high electric field can be improved.

{Manufacturing of Ceramic Powder}

FIG. 1 is a flowchart showing a flow of manufacturing ceramic powder of the piezoelectric/electrostrictive ceramic composition according to the preferred embodiment of the present invention.

For manufacturing the ceramic powder, powders of raw materials of constituent elements (Li, Na, K, Nb, Ta and the like) of the perovskite oxide except for Bi and Mn are mixed and ground (step S11). As the raw materials, oxides, carbonates, organic acid salts, alkoxides or the like of the respective constituent elements are used. Mixing and grinding can be performed by, for example, a ball mill. If the powders are mixed and ground by a wet process, an organic solvent such as ethanol, toluene or acetone can be used as a dispersing medium and the dispersing medium can be removed by evaporation, filtration or the like after the mixing and grinding.

Next, the obtained mixed materials are calcined (step S12). By doing so, the powders of the raw materials of the constituent elements of the perovskite oxide react and combine into perovskite oxide powder. This calcination is preferably carried out using a calcining profile temperature range equal to or higher than 600° C., and equal to or lower than 800° C. while staying within the calcining temperature range for a time equal to or longer than two hours, and equal to or shorter than eight hours (typically five hours) in an air atmosphere. If the highest temperature of the calcination (hereinafter, "calcination temperature") is below this range, the reaction of the raw material powders tends to be insufficient. Furthermore, if the calcination temperature exceeds this range, it tends to be difficult to carry out the subsequent grinding. Alternatively, the calcination can be carried out in an oxygen atmosphere.

It is to be noted that it is not always essential to synthesize the perovskite oxide powder by a solid phase synthesis but the powder of the perovskite oxide may also be synthesized by a liquid phase synthesis such as a sol-gel process or a hydrothermal synthesis. Alternatively, the powder of the perovskite oxide may be synthesized via intermediates including a plurality of A-site constituent elements and/or B-site constituent elements.

After synthesizing the powder of the perovskite oxide, a powder of a raw material of the Bi compound that is an additive is added to the obtained powder of the perovskite oxide and the powder of the perovskite oxide and the powder of the additive are mixed and ground (step S13). At this time, not only the Bi compound but also the Mn compound may be added to the powder of the perovskite oxide. The mixing and grinding can be carried out by a ball mill, an attritor, a sand mill, a beads mill or the like. If the powders are ground by a wet process, an organic solvent such as ethanol, toluene or acetone can be used as a dispersing medium and the dispersing medium can be removed by evaporation, filtration or the like after the mixing and grinding.

The calcining process may be carried out two or more times. In this case, only the obtained calcined powders are ground by a similar step to that of step S13, without adding the Bi compound and/or the Mn compound, and a second calcining process is then carried out. Furthermore, it is preferable that a calcination temperature in the second calcining process (hereinafter, "second calcination temperature" the same shall apply hereafter) is set equal to or higher than a first calcination temperature. If the second calcination temperature is lower than the first calcination temperature, the perovskite oxide may possibly be synthesized insufficiently.

{Manufacturing of Ceramic Sintered Body}

FIG. 2 is a flowchart showing a flow of manufacturing a ceramic sintered body of the piezoelectric/electrostrictive ceramic composition according to the preferred embodiment of the present invention. A sintered body is produced by forming the ceramic powder produced through the steps S11 to S13 (step S21) and firing a formed body (step S22). This firing allows the perovskite oxide to react with the additive.

Forming of the ceramic powder can be carried out by extrusion, injection molding, pressure forming, casting, tape forming, cold isostatic pressing (CIP) forming or the like. Firing of the formed body can be carried out by ordinary atmosphere firing or pressure firing such as hot pressing or hot isostatic pressing (HIP). Particularly, if the ceramic powder is uniaxially formed by pressure forming and then subjected to cold isostatic pressing forming, and the formed body is fired by the hot pressing, a sintered body having a large field-induced distortion during application of a high electric field can be easily obtained. Preferably, the firing is carried out using a firing profile of a temperature range equal to or higher than 900° C. and equal to or lower than 1200° C.

<2 Piezoelectric/Electrostrictive Actuator>

{Overall Configuration}

Figure 3:
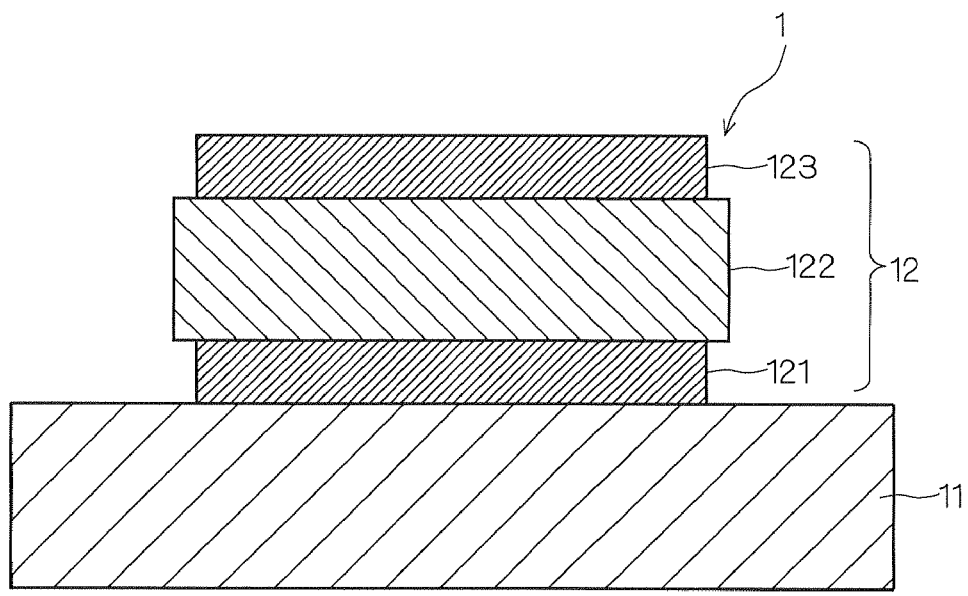
FIG. 3 is a cross-sectional view of a single layer piezoelectric/electrostrictive actuator.

FIGS. 3 and 4 are schematic diagrams exemplarily showing structures of piezoelectric/electrostrictive actuators 1 and 2 each using the piezoelectric/electrostrictive ceramic composition stated above. FIG. 3 is a cross-sectional view of the single layer piezoelectric/electrostrictive actuator 1 and FIG. 4 is a cross-sectional view of the multilayer piezoelectric/electrostrictive actuator 2.

As shown in FIG. 3, the piezoelectric/electrostrictive actuator 1 is structured to stack an electrode film 121, a piezoelectric/electrostrictive body film 122 and an electrode film 123 on an upper surface of a substrate 11 in this order. The electrode films 121 and 123 on both principal surfaces of the piezoelectric/electrostrictive body film 122 oppose each other across the piezoelectric/electrostrictive body film 122. A multilayer body 12 obtained by stacking the electrode film 121, the piezoelectric/electrostrictive body film 122 and the electrode film 123 is fixedly bonded onto the substrate 11.

As shown in FIG. 4, the piezoelectric/electrostrictive actuator 2 is structured to stack an electrode film 221, a piezoelectric/electrostrictive body film 222, an electrode film 223, a piezoelectric/electrostrictive body film 224 and an electrode film 225 on an upper surface of a substrate 21 in this order. The electrode films 221 and 223 on both principal surfaces of the piezoelectric/electrostrictive body film 222 oppose each other across the piezoelectric/electrostrictive body film 222. The electrode films 223 and 225 on both principal surfaces of the piezoelectric/electrostrictive body film 224 oppose each other across the piezoelectric/electrostrictive body film 224. A multilayer body 22 obtained by stacking the electrode film 221, the piezoelectric/electrostrictive body 222, the electrode film 223, the piezoelectric/electrostrictive body film 224 and the electrode film 225 is fixedly bonded onto the substrate 21. While FIG. 4 shows an instance of two piezoelectric/electrostrictive body film layers, the multilayer body 22 may include three or more piezoelectric/electrostrictive body film layers.

"Fixedly bonded" means herein bonding the multilayer bodies 12 and 22 onto the substrates 11 and 21 by solid phase reactions on interfaces between the substrates 11 and 21 and the multilayer bodies 12 and 22, respectively without using organic or inorganic adhesive agent. Alternatively, the multilayer bodies may be bonded onto the substrates by solid phase reactions on the interfaces between the substrates and the piezoelectric/electrostrictive body films that are the lowermost layers of the multilayer bodies.

If a voltage is applied to the piezoelectric/electrostrictive actuator 1 or 2, the piezoelectric/electrostrictive body film or films 122 or 222 and 224 stretch in a direction perpendicular to an electric field and a bending displacement occurs.

{Piezoelectric/Electrostrictive Body Film}

The piezoelectric/electrostrictive body films 122, 222 and 224 are sintered bodies of the piezoelectric/electrostrictive composition stated above.

A thickness of each of the piezoelectric/electrostrictive body films 122, 222 and 224 is preferably 0.5 micrometers (μm) to 50 μM, more preferably 0.8 μm to 40 μm, and most preferably 1 μm to 30 μm. If the thickness is below this range, densification tends to be insufficient. If the thickness exceeds this range, a shrinkage stress during sintering becomes high. Due to this shrinkage, it is necessary to make the substrates 11 and 21 thicker, with the result being that it is difficult to make the piezoelectric/electrostrictive actuators 1 and 2 smaller in size.

{Electrode Film}

A material of each of the electrode films 121, 123, 221, 223 and 225 is a metal such as platinum, palladium, rhodium, gold or silver or an alloy of these metals. More preferably, the material is platinum or an alloy mainly containing platinum since platinum or the alloy mainly containing platinum has high heat resistance during firing. Depending on a firing temperature, a silver-palladium alloy or the like can also be suitably used as the material of each of the electrode films 121, 123, 221, 223 and 225.

A thickness of each of the electrode films 121, 123, 221, 223 and 225 is preferably equal to or smaller than 15 μm, more preferably equal to or smaller than 5 μm. If the thickness exceeds this range, then each of the electrode films 121, 123, 221, 223 and 225 then functions as a buffer layer and the bending displacement tends to be small. Therefore, when the thickness is preferably equal to or larger than 0.05 μm, each of the electrode films 121, 123, 221, 223 and 225 appropriately fulfills its function.

It is preferable to form the electrode films 121 and 123 or 221, 223 and 225 to cover the regions substantially contributing to bending displacement of the piezoelectric/electrostrictive body films 122, 222 and 224. For example, it is preferable to form the electrode films 121 and 123 or 221, 223 and 225 to cover the regions that are 80% or more of both principal surfaces of each of the piezoelectric/electrostrictive body films 122, 222 and 224 including a central portion thereof.

{Substrate}

Although a material of each of the substrates 11 and 21 is ceramics, the type of the ceramics is not limited to a specific one. Nevertheless, in view of high heat resistance, high chemical stability and high insulation properties needed, it is preferable that the material of each of the substrates 11 and 21 contains at least one type of ceramic selected from a group consisting of stabilized zirconium oxide, aluminum oxide, magnesium oxide, mullite, aluminum nitride, silicon nitride and glass. In view of mechanical strength and tenacity, the material is more preferably the stabilized zirconium oxide. The "stabilized zirconium oxide" means a zirconium oxide in which crystal phase transition is repressed by addition of a stabilizer and contains partially stabilized zirconium oxide in addition to the stabilized zirconium oxide.

Examples of the stabilized zirconium oxide include zirconium oxides containing, each as a stabilizer, 1 to 30 mol % of calcium oxide, magnesium oxide, yttrium oxide, ytterbium oxide, cerium oxide or a rare-earth metal oxide. Preferably, the stabilized zirconium oxide is the zirconium oxide containing the yttrium oxide as the stabilizer because of high mechanical strength. A content of the yttrium oxide is preferably 1.5 mol % to 6 mol %, more preferably 2 mol % to 4 mol %. It is further preferable to contain 0.1 mol % to 5 mol % of aluminum oxide in addition to the yttrium oxide. Crystal phases of the stabilized zirconium oxide may be a mixture system of a cubic system and a monoclinic system, a mixture system of a tetragonal system and a monoclinic system, a mixture system of a cubic system, a tetragonal system and a monoclinic system or the like. Preferably, a main crystal phase is the mixture system of the tetragonal system and the cubic system or the tetragonal system in view of high mechanical strength, high tenacity and high durability.

A thickness of each of the substrates 11 and 21 is preferably 1 μm to 1000 μm, more preferably 1.5 μm to 500 μm, most preferably 2 μm to 200 μm. If the thickness is below this range, mechanical strength of each of the piezoelectric/electrostrictive actuators 1 and 2 tends to fall. If the thickness exceeds this range, rigidity of each of the substrates 11 and 21 is high and the bending displacement caused by stretching of the piezoelectric/electrostrictive body film 122 or films 222 and 224 following the application of a voltage is limited.

A surface shape (shape of a surface onto which each of the multilayer bodies 12 and 22 is fixedly bonded) of each of the substrates 11 and 21 is not limited to a specific shape and can be triangular, tetragonal (rectangular or square), elliptical or circular. If the surface shape is rectangular or tetragonal, corners may be rounded. Alternatively, the surface shape may be a combination of these basic shapes.

The substrate 11 of the single layer piezoelectric/electrostrictive actuator 1 has a uniform thickness. On the other hand, the substrate 21 of the multilayer piezoelectric/electrostrictive actuator 2 is configured so that a central portion 215 onto which the multilayer body 22 is bonded is thinner than peripheral portions 216. This is intended to increase the bending, displacement while maintaining the mechanical strength of the substrate 21. It is to be noted that the substrate 21 may be used as the substrate of the single layer piezoelectric/electrostrictive actuator 1.

Figure 5:
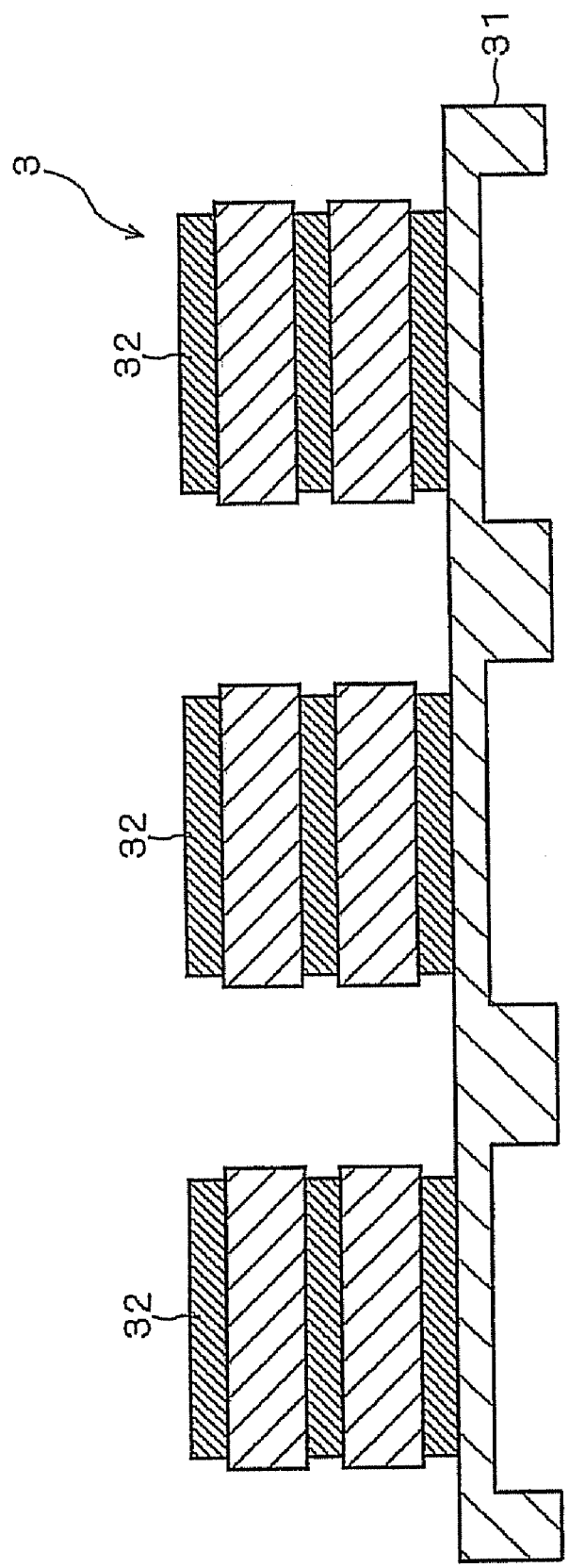
FIG. 5 is a cross-sectional view of a multilayer piezoelectric/electrostrictive actuator.

As shown in the cross-sectional view of FIG. 5, a substrate 31 configured so that the substrate 21 shown in FIG. 4 is repeatedly provided as a unit structure may be used. In this case, a multilayer body 32 is fixedly bonded onto each of unit structures, thus piezoelectric/electrostrictive actuator 3 being constituted.

{Manufacturing of Piezoelectric/Electrostrictive Actuator}

For manufacturing the single layer piezoelectric/electrostrictive actuator 1, the electrode film 121 is formed first on the substrate 11. The electrode film 121 can be formed by a method such as ion beam machining, sputtering, vacuum deposition, PVD (Physical Vapor Deposition), ion plating, CVD (Chemical Vapor Deposition), plating, aerosol deposition, screen printing, spraying, dipping or the like. Preferably, the sputtering or the screen printing is used in view of good bondability between the substrate 11 and the piezoelectric/electrostrictive body film 122. The electrode film 121 thus formed can be fixedly bonded onto the substrate 11 and the piezoelectric/SUBSTITUTE electrostrictive body film 122 by heat treatment. A heat treatment temperature is approximately 500° C. to 1400° C., depending on the material and a formation method of the electrode film 121.

Next, the piezoelectric/electrostrictive body film 122 is formed on the electrode film 121. The piezoelectric/electrostrictive body film 122 can be formed by a method such as ion beam machining, sputtering, vacuum deposition, PVD, ion plating, CVD, plating, a sol-gel process, aerosol deposition, screen printing, spraying, dipping or the like. Preferably, the screen printing is used since the piezoelectric/electrostrictive body film 122 can be formed with an accurate plane shape and an accurate thickness continuously.

The electrode film 123 is then formed on the piezoelectric/electrostrictive body film 122. The electrode film 123 can be formed similarly to the electrode film 121.

Thereafter, the substrate 11 on which the multilayer body 12 is formed is integrally fired. This firing promotes sintering of the piezoelectric/electrostrictive body film 122 and heat treatments on the electrode films 121 and 123. The highest firing temperature of the piezoelectric/electrostrictive body film 122 is preferably 800° C. to 1250° C., more preferably 900° C. to 1200° C. If the temperature is below this range, then densification of the piezoelectric/electrostrictive body film 122 tends to be insufficient, the electrode film 121 tends to be insufficiently bonded onto the substrate 11 and the electrode films 121 and 123 tend to be insufficiently bonded onto the piezoelectric/electrostrictive body film 122. If the temperature exceeds this range, piezoelectric/electrostrictive properties of the piezoelectric/electrostrictive body film 122 tend to be deteriorated. Further, the highest firing temperature is maintained for preferably one minute to ten hours, more preferably five minutes to four hours. If the time is below this range, densification of the piezoelectric/electrostrictive body film 122 tends to be insufficient. If the time exceeds this range, the piezoelectric/electrostrictive properties of the piezoelectric/electrostrictive body film 122 tend to be deteriorated.

Although the heat treatments are preferably carried out on the electrode films 121 and 123 along with firing from viewpoints of productivity, this does not preclude a heat treatment from being carried out whenever each of the electrode films 121 and 123 is formed. Nevertheless, if the piezoelectric/electrostrictive body film 122 is fired before a heat treatment is carried out on the electrode film 123, a heat treatment is carried out on the electrode film 123 at a temperature lower than a firing temperature of the piezoelectric/electrostrictive body film 122.

After end of burning, polarization is performed under appropriate conditions. The polarization can be performed by a well-known method and preferably performed while heating the piezoelectric/electrostrictive body film 122 at 40° C. to 200° C., depending on a Curie temperature of the piezoelectric/electrostrictive body film 122.

The multilayer piezoelectric/electrostrictive actuator 2 can be similarly manufactured to the single layer piezoelectric/electrostrictive actuator 1 except that the number of piezoelectric/electrostrictive body films and electrode films to be formed increase.

Alternatively, the piezoelectric/electrostrictive actuator 1 can be manufactured by a green sheet layering method ordinarily used to manufacture multilayer ceramic electronic components. In the green sheet layering method, a binder, a plasticizer, a dispersing agent and a dispersing medium are added to material powders and the resultant powders are mixed by a ball mill or the like. A resultant slurry is formed into a sheet shape by a doctor blade or the like, thus obtaining a formed body.

Thereafter, electrode paste films are printed on both principal surfaces of the formed body by the screen printing or the like, respectively. An electrode paste used herein is obtained by adding a solvent, a vehicle, glass frit or the like to powders of the metal or alloy stated above.

Further, the formed body having the electrode paste films printed on the both principal surfaces, respectively is pressure-bonded onto the substrate.

Thereafter, the substrate on which the multilayer body is formed is integrally burned and the polarization is performed under appropriate conditions after firing.

<3 Another Example of Piezoelectric/Electrostrictive Actuator>

Figure 6:
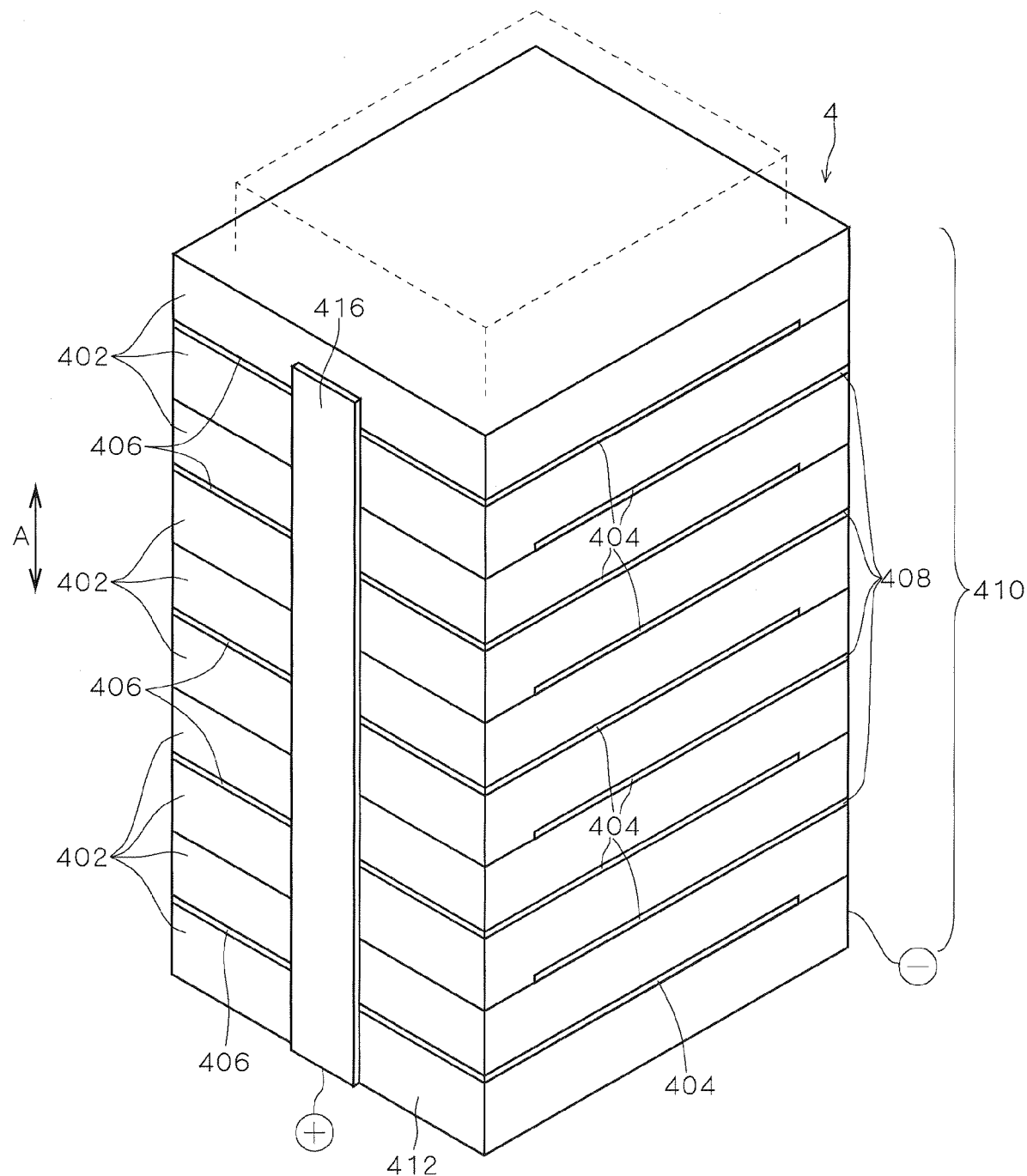
FIG. 6 is a perspective view of a piezoelectric/electrostrictive actuator.
Figure 7:
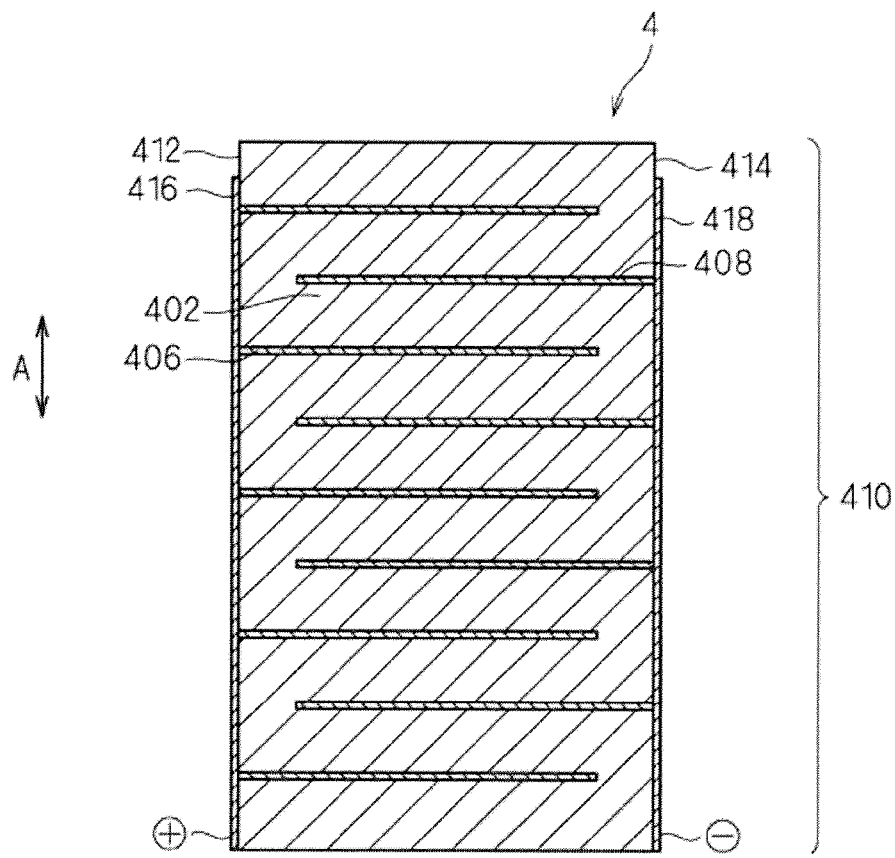
FIG. 7 is a longitudinal sectional view of the piezoelectric/electrostrictive actuator.
Figure 8:
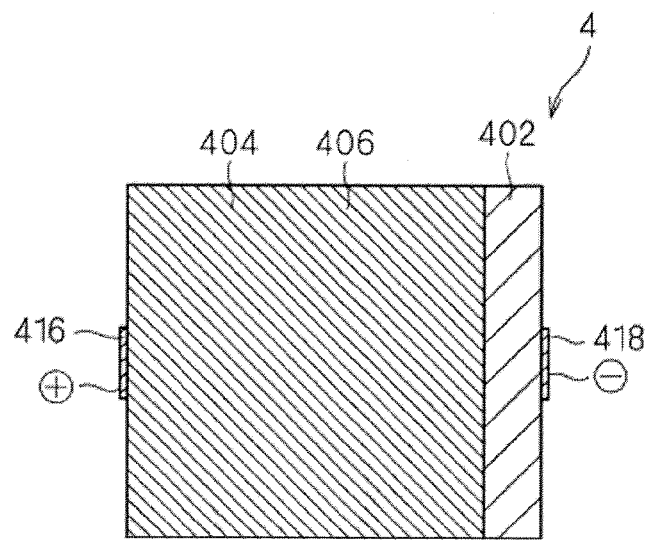
FIG. 8 is a cross-sectional view of the piezoelectric/electrostrictive actuator.

FIGS. 6 to 8 are schematic diagrams exemplarily showing a structure of a piezoelectric/electrostrictive actuator 4 using the above-stated piezoelectric/electrostrictive ceramic composition. FIG. 6 is a perspective view of the piezoelectric/electrostrictive actuator 4, FIG. 7 is a longitudinal sectional view of the piezoelectric/electrostrictive actuator 4 and FIG. 8 is a cross-sectional view of the piezoelectric/electrostrictive actuator 4.

Figure 9:
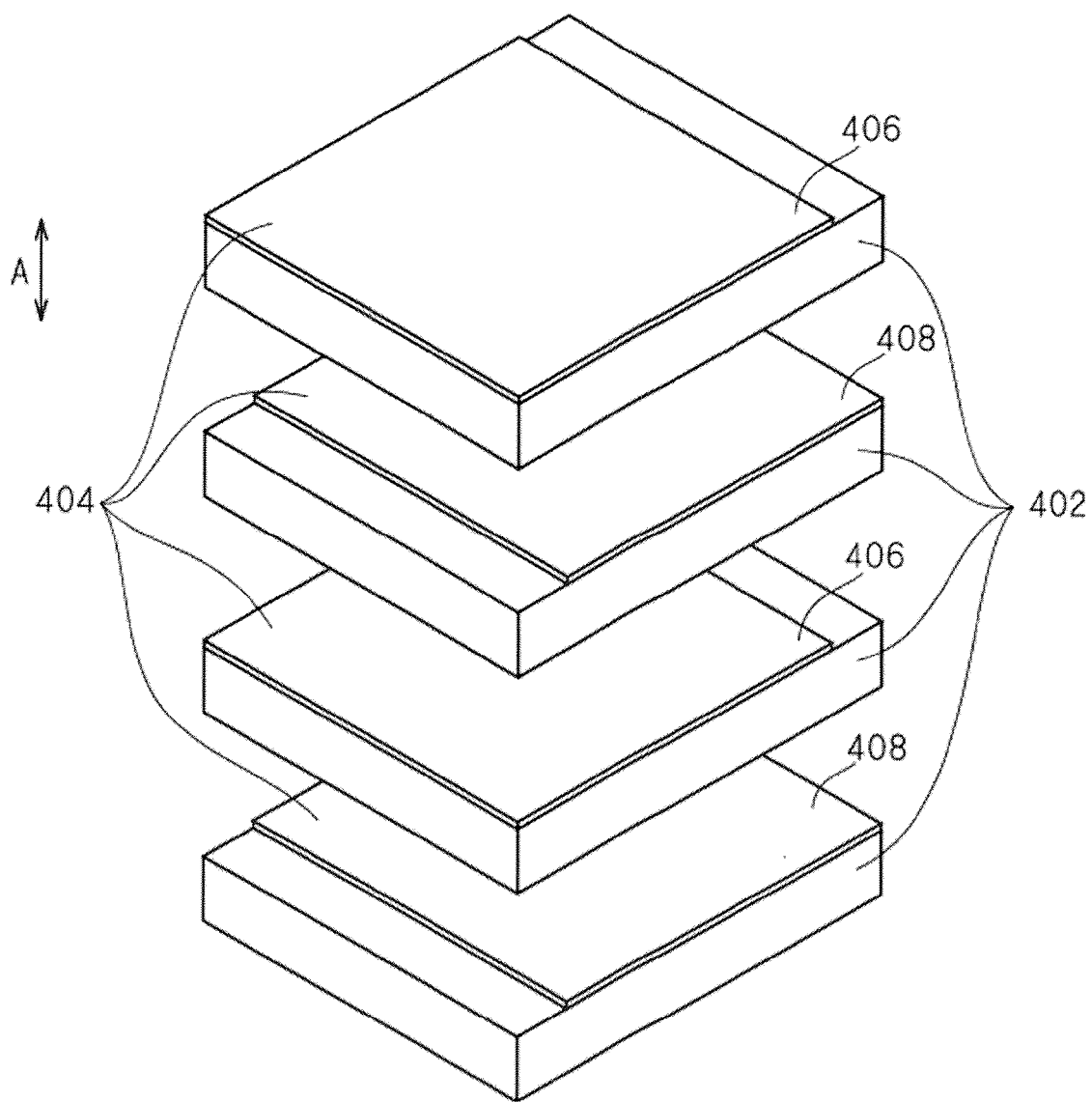
FIG. 9 is a partially exploded perspective view of the piezoelectric/electrostrictive actuator.

As shown in FIGS. 6 to 8, the piezoelectric/electrostrictive actuator 4 is structured to alternately stack piezoelectric/electrostrictive body films 402 and internal electrode films 404 in a direction of an axis A and to form external electrode films 416 and 418 on end surfaces 412 and 414 of a multilayer body 410 obtained by stacking the piezoelectric/electrostrictive body films 402 and the internal electrode films 404, respectively. As shown in an exploded perspective view of FIG. 9 showing a state in which the piezoelectric/electrostrictive actuator 4 is partially exploded in the direction of the axis A, the internal electrode films 404 include first internal electrode films 406 that reach the end surface 412 but do not reach the end surface 414 and second internal electrode films 408 that reach the end surface 414 but do not reach the end surface 412. The first internal electrode films 406 and the second internal electrode films 408 are alternately provided. Each of the first internal electrode films 406 are in contact with the external electrode film 416 on the end surface 412 and electrically connected to the external electrode film 416. Each of the second internal electrode films 408 are in contact with the external electrode film 418 on the end surface 414 and electrically connected to the external electrode film 418. Therefore, if the external electrode film 416 is connected to a positive side of a driving signal source and the external electrode film 418 is connected to a negative side thereof, a driving signal will be applied to the first internal electrode films 406 and the second internal electrode films 408 opposing one another across the piezoelectric/electrostrictive body films 402 and an electric field is applied in a thickness direction of the piezoelectric/electrostrictive body films 402. As a result, the piezoelectric/electrostrictive body films 402 stretch in the thickness direction and the multilayer body 410 deforms into a shape indicated by a broken line in FIG. 6 as a whole.

Unlike the piezoelectric/electrostrictive actuators 1 to 3 stated above, the piezoelectric/electrostrictive actuator 4 does not include a substrate onto which the multilayer body 410 is fixedly bonded. Further, the piezoelectric/electrostrictive actuator 4 is also referred to as an "offset-type piezoelectric/electrostrictive actuator" since the first internal electrode films 406 and the second internal electrode films 408 having different patterns are alternately provided.

The piezoelectric/electrostrictive body films 402 are sintered bodies of the piezoelectric/electrostrictive ceramic composition stated above. A thickness of each of the piezoelectric/electrostrictive body films 402 is preferably 5 μm to 500 μm. If the thickness is below this range, it is difficult to produce green sheets described below. If the thickness exceeds this range, it is difficult to apply a sufficient electric field to the piezoelectric/electrostrictive body films 402.

A material of each of the internal electrode films 404 and the external electrode films 416 and 418 are metals such as platinum, palladium, rhodium, gold or silver or an alloy thereof. The material of the external electrode films 404 is more preferably platinum or an alloy mainly containing platinum since the platinum or the alloy mainly containing platinum has high heat resistance during firing and the internal electrode films 404 made of the platinum or an alloy mainly containing platinum can be easily co-sintered with the piezoelectric/electrostrictive body films 402. Depending on a firing temperature, a silver-palladium alloy or the like can be suitably used as the material of the internal electrode films 404.

A thickness of each of the internal electrode films 404 is preferably equal to or smaller than 10 μm. If the thickness exceeds this range, then each of the internal electrode films 404 functions as a buffer layer and the bending displacement tends to be small. Moreover, the thickness is preferably equal to or larger than 0.1 μM so that each of the internal electrode films 404 appropriately fulfills its function.

While FIGS. 6 to 8 show an instance in which ten piezoelectric/electrostrictive body films 402 are provided, the number of the piezoelectric/electrostrictive body films 402 may be equal to or smaller than nine or equal to or greater than eleven.

For manufacturing the piezoelectric/electrostrictive actuator 4, a binder, a plasticizer, a dispersing agent and a dispersing medium are added to material powders of the piezoelectric/electrostrictive ceramic composition and the resultant powders are mixed by a ball mill or the like. A resultant slurry is formed into a sheet shape by a doctor blade or the like, thus obtaining green sheets.

Next, the green sheets are punched using a punch or a die, thereby forming positioning holes or the like in the green sheets.

Further, electrode paste is coated onto a surface of each of the green sheets by the screen printing or the like, thereby obtaining the green sheets each having electrode paste patterns formed thereon. The electrode paste patterns include two types of patterns, that is, a first electrode paste pattern that becomes the first internal electrode films 406 after firing and a second electrode paste pattern that becomes the second internal electrode films 408 after firing. Needless to say, only one type of the electrode paste pattern may be used and directions of the green sheets are alternately turned by 180° so as to obtain the internal electrode films 406 and 408 after firing.

Next, the green sheets each having the first electrode paste pattern formed thereon and the green sheets each having the second electrode paste pattern formed thereon are alternately superimposed, a green sheet onto which no electrode paste is coated is superimposed on an uppermost portion and the superimposed green sheets are pressed in a thickness direction, thereby press-bonding the green sheets. At this time, the green sheets are bonded so as to make positions of the positioning holes of the green sheets uniform. Moreover, it is preferable to pressure-bond the green sheets while being heated with a die used for pressure-bonding during the pressure-bonding of the superimposed green sheets.

A pressure-bonded body of the green sheets thus obtained is fired and an obtained sintered body is worked by a dicing saw or the like, thereby making it possible to obtain the multilayer body 410. The external electrode films 416 and 418 are formed on the end surfaces 412 and 414 of the multilayer body 410, respectively by baking, vacuum deposition, sputtering or the like and polarization is then performed. As a result, the piezoelectric/electrostrictive actuator 4 is obtained.

<4 Experiment 1>

In an experiment 1, powders of $Li_2CO_3$ (lithium carbonate), $C_6H_5O_6Na \cdot H_2O$ (sodium tartrate monohydrate), $C_6H_5O_6K$ (potassium tartrate), niobium oxide ($Nb_2O_5$) and tantalum oxide ($Ta_2O_5$) were weighed so as to provide a composition of $\{Li_{0.06}(Na_{0.55}K_{0.45})_{0.94}\}_{1.01}(Nb_{0.918}Ta_{0.082})O_3$ (a=1.01, x=0.45, y=0.06 and z=0.082). Alcohol was added, as a dispersing medium, to the weighed powders of raw materials and the resultant powders were mixed and ground by the ball mill.

After removing the dispersing medium from the obtained slurry, s first calcination was carried out using a calcining profile temperature of 800° C. for five hours, thus the powders of a perovskite oxide are synthesized.

Next, alcohol was added, as a dispersing medium, to the obtained perovskite oxide and the resultant perovskite oxide was ground by the ball mill.

After removing the dispersing medium from the obtained slurry, a second calcination was carried out again using a calcining profile temperature of 800° C. for five hours.

Next, powders of the perovskite oxide were calcined twice and powders of $Bi_2O_3$ serving as an additive were weighed so that an addition amount of the $Bi_2O_3$ in terms of Bi atoms was 0.01 molar part to 0.2 molar part with respect to 100 molar parts of the perovskite oxide. Alcohol was added, as a dispersing medium, to the weighed powders of the perovskite oxide and the $Bi_2O_3$ and the resultant powders were mixed and ground by the ball mill. The dispersing medium was removed from an obtained slurry.

After producing ceramic powder as stated above, the ceramic powder mixed with a binder was uniaxially pressed into a disc shape having a diameter of 20 millimeters (mm) and a thickness of 6 mm at a pressure of $2.0 \times 10^8$ Pa and further subjected to CIP forming. A formed body was then fired using a firing profile temperature of 1000° C. for three hours in an air atmosphere and at atmospheric pressure, thus obtaining a sintered body (piezoelectric/electrostrictive body).

The obtained sintered body was worked into a rectangular shape with a major side of 12 mm, a minor side of 3 mm and a thickness of 1 mm, and gold electrodes were formed on both principal surfaces of the rectangular sintered body by sputtering, respectively. The resultant body was dipped in silicon oil at a room temperature and a voltage of 5 kV/mm was applied to the gold electrodes on both principal surfaces, thereby performing polarization on the body in a thickness direction.

Figure 10:
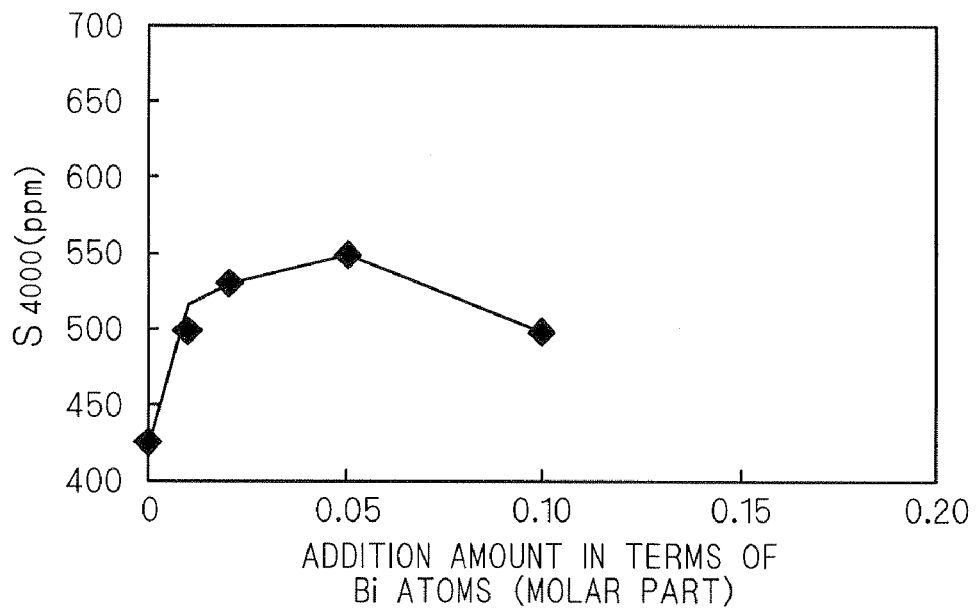
FIG. 10 is a chart showing a change of a distortion factor $S_{4000}$ relative to an addition amount of Bi.
Figure 11:
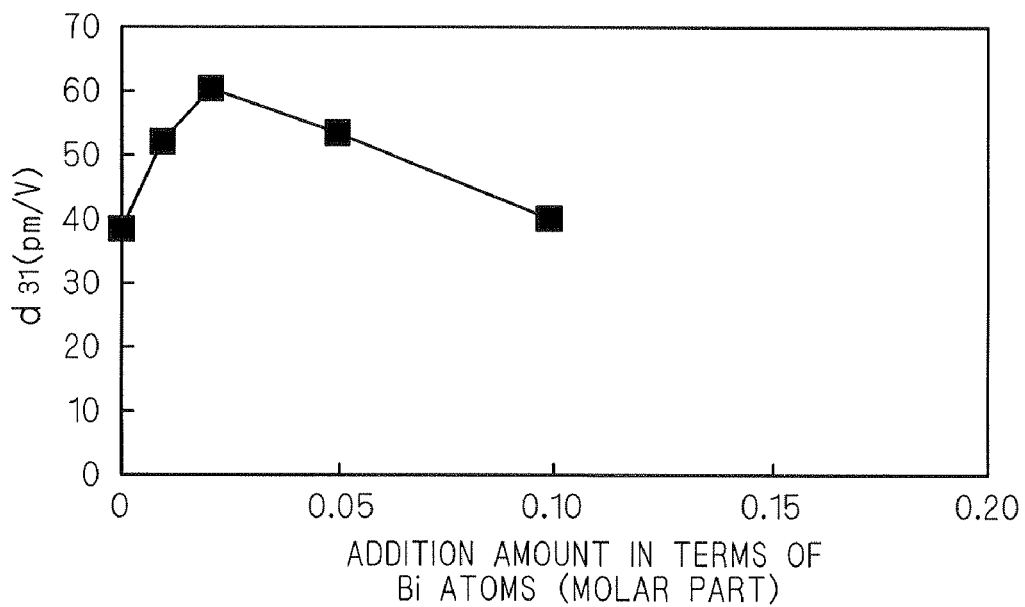
FIG. 11 is a chart showing a change of a piezoelectric constant $d_{31}$ relative to the addition amount of Bi.

A distortion factor $S_{4000}$ (ppm) of a piezoelectric/electrostrictive element thus produced and that of a piezoelectric/electrostrictive element produced similarly to the former piezoelectric/electrostrictive element except that $Bi_2O_3$ was not added were measured each as an index of a magnitude of a field-induced distortion during application of a high electric field. As an index of piezoelectric/electrostrictive properties, a piezoelectric constant $d_{31}$ (pm/V) was measured. FIGS. 10 and 11 and TABLE 1 show measurement results. Graphs of FIGS. 10 and 11 show changes of the distortion factor $S_{4000}$ and the piezoelectric constant $d_{31}$ relative to the addition amount of Bi in terms of Bi atoms, respectively. TABLE 1 shows values of x, y, a and z of the general formula of $\{Li_y(Na_{1-x}K_x)_{1-y}\}_a(Nb_{1-z}Ta_z)O_3$, the addition amount of Bi in terms of Bi atoms, the distortion factor $S_{4000}$ and the piezoelectric constant $d_{31}$ for each of samples 1 to 6.

TABLE 1

| Sample | x | y | a | z | Addition amount in terms of Bi atoms (molar part) | $S_{4000}$ (ppm) | $d_{31}$ (pm/V) |
|---|---|---|---|---|---|---|---|
| 1* | 0.45 | 0.06 | 1.01 | 0.082 | 0 | 420 | 38 |
| 2 | 0.45 | 0.06 | 1.01 | 0.082 | 0.01 | 500 | 52 |
| 3 | 0.45 | 0.06 | 1.01 | 0.082 | 0.02 | 530 | 60 |
| 4 | 0.45 | 0.06 | 1.01 | 0.082 | 0.05 | 550 | 53 |
| 5 | 0.45 | 0.06 | 1.01 | 0.082 | 0.10 | 500 | 40 |
| 6 | 0.45 | 0.06 | 1.01 | 0.082 | 0.20 | X | X |

*Comparative Example

The distortion factor $S_{4000}$ was obtained by measuring a field-induced distortion in a major side direction when a voltage of 4 kV/mm was applied to the gold electrodes on the both principal surfaces by a distortion gauge. The piezoelectric constant $d_{31}$ was obtained by measuring frequency-impedance characteristics and a capacitance of each piezoelectric/electrostrictive element by an impedance analyzer and by calculating the distortion factor $S_{4000}$ from a resonance frequency and an antiresonance frequency of fundamental wave of an extension oscillation in the major side direction, the capacitance and dimensions.

As shown in FIG. 10 and TABLE 1, the distortion factor $S_{4000}$ improved by addition of $Bi_2O_3$. Further, the distortion factor $S_{4000}$ was high if the addition amount of the $Bi_2O_3$ is 0.01 molar part to 0.1 molar part in terms of Bi atoms and particularly high if the addition amount of the $Bi_2O_3$ is 0.02 molar part to 0.05 molar part in terms of Bi atoms.

<5 Experiment 2>

In experiment 2, powders of the perovskite oxide similarly to those of experiment 1, and powders of $Bi_2O_3$ and $MnO_2$ serving as an additive were weighed so that an addition amount of the $Bi_2O_3$ in terms of Bi atoms was 0.01 molar part to 0.2 molar part with respect to 100 molar parts of the perovskite oxide, and so that an addition amount of the $MnO_2$ in terms of Mn atoms was 0.02 molar part with respect to 100 molar parts of the perovskite oxide. Alcohol was added, as a dispersing medium, to the weighed powders of the perovskite oxide, the $Bi_2O_3$ and $MnO_2$ and the resultant powders were mixed and ground by the ball mill.

Figure 12:
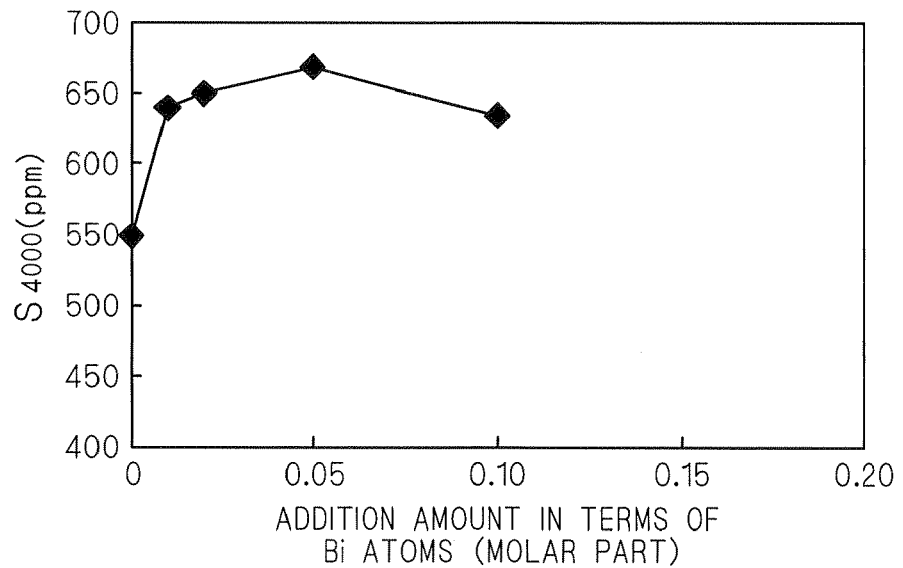
FIG. 12 is a chart showing a change of a distortion factor $S_{4000}$ of an Mn-added composition relative to the addition amount of Bi.
Figure 13:
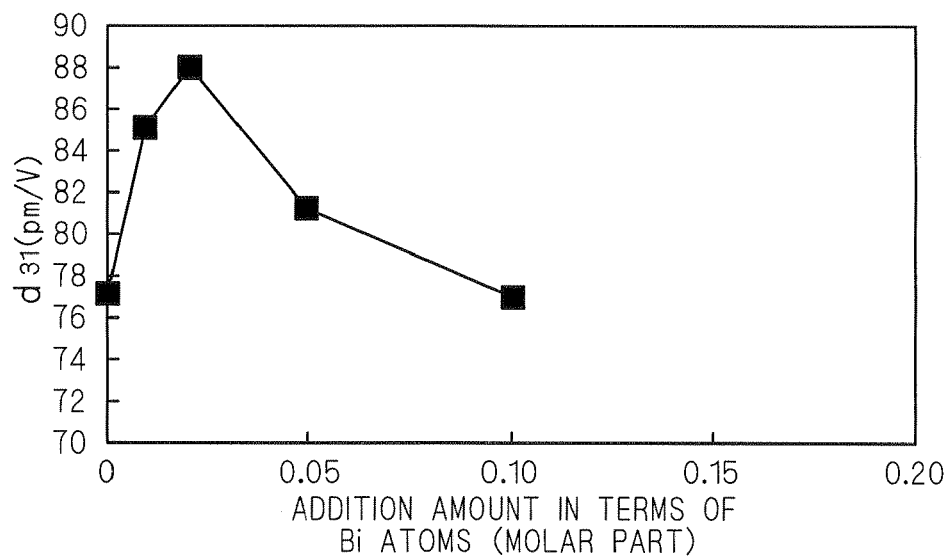
FIG. 13 is a chart showing a change of a piezoelectric constant $d_{31}$ of the Mn-added composition relative to the addition amount of Bi.

Piezoelectric/electrostrictive elements were produced and evaluated similarly to experiment 1. FIGS. 12 and 13 and TABLE 2 show measurement results. Graphs of FIGS. 12 and 13 show changes of the distortion factor $S_{4000}$ and the piezoelectric constant $d_{31}$ relative to the addition amount of Bi in terms of Bi atoms, respectively. TABLE 2 shows values of x, y, a and z of the general formula of $\{Li_y(Na_{1-x}K_x)_{1-y}\}_a(Nb_{1-z}Ta_z)O_3$, the addition amount of Bi in terms of Bi atoms, the addition amount of Mn in terms of Mn atoms, the distortion factor $S_{4000}$ and the piezoelectric constant $d_{31}$ for each of samples 7 to 12. The measurement result shows that the distortion factor $S_{4000}$ improved if the addition amount of $Bi_2O_3$ was up to 0.1 molar part in terms of Bi atoms, and that a range of the addition amount of $Bi_2O_3$ in which a maximum distortion amount is obtained is 0.02 molar part to 0.05 molar part. If the addition amount of $Bi_2O_3$ was equal to or greater than 0.2 molar part in terms of Bi atoms, the sintered bodies cracked and the piezoelectric/electrostrictive elements could not be evaluated.

amount of Bi in terms of Bi atoms, the distortion factor $S_{4000}$ and the piezoelectric constant $d_{31}$ for each of samples 13 to 31.

TABLE 3

| Sample | x | y | a | z | Addition amount in terms of Bi atoms (molar part) | $S_{4000}$ (ppm) | $d_{31}$ (pm/V) |
|---|---|---|---|---|---|---|---|
| 13 | 0.30 | 0.03 | 1.005 | 0.030 | 0.02 | 480 | 50 |
| 14 | 0.30 | 0.03 | 1.005 | 0.030 | 0.10 | 500 | 48 |
| 15 | 0.60 | 0.07 | 1.100 | 0.300 | 0.02 | 530 | 52 |
| 16 | 0.60 | 0.07 | 1.100 | 0.300 | 0.10 | 540 | 57 |
| 17* | 0.30 | 0.03 | 1.005 | 0.030 | 0 | 400 | 28 |
| 18 | 0.30 | 0.03 | 1.005 | 0.030 | 0.20 | X | X |
| 19* | 0.60 | 0.07 | 1.100 | 0.300 | 0 | 420 | 30 |
| 20 | 0.60 | 0.07 | 1.100 | 0.300 | 0.20 | X | X |
| 21* | 0.45 | 0.06 | 1.000 | 0.082 | 0.03 | 360 | 26 |
| 22 | 0.45 | 0.06 | 1.005 | 0.082 | 0.03 | 525 | 45 |
| 23 | 0.45 | 0.06 | 1.050 | 0.082 | 0.03 | 505 | 48 |
| 24 | 0.45 | 0.06 | 1.100 | 0.082 | 0.03 | 470 | 42 |
| 25 | 0.45 | 0.03 | 1.010 | 0.082 | 0.03 | 590 | 70 |
| 26 | 0.45 | 0.07 | 1.010 | 0.082 | 0.03 | 535 | 50 |
| 27 | 0.30 | 0.06 | 1.010 | 0.082 | 0.03 | 525 | 57 |
| 28 | 0.60 | 0.06 | 1.010 | 0.082 | 0.03 | 510 | 44 |
| 29 | 0.45 | 0.06 | 1.010 | 0 | 0.03 | 450 | 46 |
| 30 | 0.45 | 0.06 | 1.010 | 0.200 | 0.03 | 470 | 44 |
| 31 | 0.45 | 0.06 | 1.010 | 0.300 | 0.03 | 465 | 40 |

*Comparative Example

Next, similarly to experiment 1, first calcination and second calcination were carried out.

Powders of the perovskite oxide were calcined twice and powders of $Bi_2O_3$ serving as an additive were weighed so that an addition amount of the $Bi_2O_3$ in terms of Bi atoms are shown in TABLE 3 with respect to 100 molar parts of the perovskite oxide. Alcohol was added, as a dispersing medium, to the weighed powders of the perovskite oxide and the $Bi_2O_3$ and the resultant powders were mixed and ground by the ball mill. The dispersing medium was removed from an obtained slurry.

Piezoelectric/electrostrictive elements were produced and the distortion factors $S_{4000}$ (ppm) and the piezoelectric constants $d_{31}$ were measured similarly to experiment 1. TABLE 3 shows the measurement results. According to the measurement results, as for samples that could be evaluated, good distortion factors $S_{4000}$ were obtained except for the samples 17 and 19 where in each of which the addition amount of Bi

TABLE 2

| Sample | x | y | a | z | Addition amount in terms of Mn atoms (molar part) | Addition amount in terms of Bi atoms (molar part) | $S_{4000}$ (ppm) | $d_{31}$ (pm/V) |
|---|---|---|---|---|---|---|---|---|
| 7* | 0.45 | 0.06 | 1.01 | 0.082 | 0.02 | 0 | 550 | 77 |
| 8 | 0.45 | 0.06 | 1.01 | 0.082 | 0.02 | 0.01 | 640 | 85 |
| 9 | 0.45 | 0.06 | 1.01 | 0.082 | 0.02 | 0.02 | 650 | 88 |
| 10 | 0.45 | 0.06 | 1.01 | 0.082 | 0.02 | 0.05 | 670 | 81 |
| 11 | 0.45 | 0.06 | 1.01 | 0.082 | 0.02 | 0.10 | 635 | 77 |
| 12 | 0.45 | 0.06 | 1.01 | 0.082 | 0.02 | 0.20 | X | X |

*Comparative Example

<6 Experiment 3>

In experiment 3, powders of $Li_2CO_3$, $C_6H_5O_6Na.H_2O$, $C_6H_5O_6K$, $Nb_2O_5$ and $Ta_2O_5$ were weighed so as to provide a composition shown in TABLE 3. Alcohol was added, as a dispersing medium, to the weighed powders of raw materials and the resultant powders were mixed and ground by the ball mill. TABLE 3 shows values of x, y, a and z of the general formula of $\{Li_y(Na_{1-x}K_x)_{1-y}\}_a(Nb_{1-z}Ta_z)O_3$, the addition in terms of Bi atoms was "0" and also sample 21 in which a ratio "a" of the total number of atoms of A-site elements to the total number of atoms of B-site elements is equal to or lower than 1. As for the samples 18 and 20 in each of which the addition amount of $Bi_2O_3$ in terms of Bi atoms was equal to or greater than 0.2 molar part, the sintered bodies cracked and the piezoelectric/electrostrictive elements could not be evaluated.

<7 Experiment 4>

In experiment 4, powders of $Li_2CO_3$, $C_6H_5O_6Na \cdot H_2O$, $C_6H_5O_6K$, $Nb_2O_5$ and $Ta_2O_5$ were weighed so as to provide a composition shown in TABLE 4. Alcohol was added, as a dispersing medium, to the weighed powders of raw materials and the resultant powders were mixed and ground by the ball mill. TABLE 4 shows values of x, y, a and z of the general formula of $\{Li_y(Na_{1-x}K_x)_{1-y}\}_a(Nb_{1-z}Ta_z)O_3$, the addition amount of Bi in terms of Bi atoms, the distortion factor $S_{4000}$ and the piezoelectric constant $d_{31}$ for each of samples 32 to 53.

TABLE 4

| Sample | x | y | a | z | Addition amount in terms of Mn atoms (molar part) | Addition amount in terms of Bi atoms (molar part) | $S_{4000}$ (ppm) | $d_{31}$ (pm/V) |
|---|---|---|---|---|---|---|---|---|
| 32 | 0.30 | 0.03 | 1.005 | 0.030 | 0.02 | 0.02 | 610 | 80 |
| 33 | 0.30 | 0.03 | 1.005 | 0.030 | 0.02 | 0.10 | 615 | 82 |
| 34 | 0.60 | 0.07 | 1.100 | 0.300 | 1.00 | 0.02 | 630 | 80 |
| 35 | 0.60 | 0.07 | 1.100 | 0.300 | 1.00 | 0.10 | 635 | 83 |
| 36* | 0.30 | 0.03 | 1.005 | 0.030 | 0.02 | 0 | 530 | 70 |
| 37 | 0.30 | 0.03 | 1.005 | 0.030 | 0.02 | 0.20 | X | X |
| 38* | 0.60 | 0.07 | 1.100 | 0.300 | 1.00 | 0 | 540 | 75 |
| 39 | 0.60 | 0.07 | 1.100 | 0.300 | 1.00 | 0.20 | X | X |
| 40* | 0.45 | 0.06 | 1.000 | 0.082 | 0.02 | 0.03 | 530 | 76 |
| 41 | 0.45 | 0.06 | 1.005 | 0.082 | 0.02 | 0.03 | 655 | 90 |
| 42 | 0.45 | 0.06 | 1.050 | 0.082 | 0.02 | 0.03 | 640 | 80 |
| 43 | 0.45 | 0.06 | 1.100 | 0.082 | 0.02 | 0.03 | 610 | 79 |
| 44 | 0.45 | 0.03 | 1.010 | 0.082 | 0.02 | 0.03 | 615 | 84 |
| 45 | 0.45 | 0.07 | 1.010 | 0.082 | 0.02 | 0.03 | 660 | 86 |
| 46 | 0.30 | 0.06 | 1.010 | 0.082 | 0.02 | 0.03 | 655 | 84 |
| 47 | 0.60 | 0.06 | 1.010 | 0.082 | 0.02 | 0.03 | 635 | 79 |
| 48 | 0.45 | 0.06 | 1.010 | 0.000 | 0.02 | 0.03 | 580 | 78 |
| 49 | 0.45 | 0.06 | 1.010 | 0.200 | 0.02 | 0.03 | 610 | 80 |
| 50 | 0.45 | 0.06 | 1.010 | 0.300 | 0.02 | 0.03 | 595 | 77 |
| 51 | 0.45 | 0.06 | 1.010 | 0.082 | 0.05 | 0.03 | 655 | 91 |
| 52 | 0.45 | 0.06 | 1.010 | 0.082 | 0.10 | 0.03 | 650 | 93 |
| 53 | 0.45 | 0.06 | 1.010 | 0.082 | 1.00 | 0.03 | 625 | 90 |

*Comparative Example

Next, similarly to experiment 1, the first calcination and the second calcination were carried out.

Powders of the perovskite oxide calcined twice and powders of $Bi_2O_3$ and $MnO_2$ serving as an additive were weighed so that an addition amount of the $Bi_2O_3$ in terms of Bi atoms are shown in TABLE 4 with respect to 100 molar parts of the perovskite oxide and so that an addition amount of the $MnO_2$ in terms of Mn atoms are also shown in TABLE 4 with respect to 100 molar parts of the perovskite oxide. Alcohol was added, as a dispersing medium, to the weighed powders of the perovskite oxide, the $Bi_2O_3$ and $MnO_2$ and the resultant powders were mixed and ground by a ball mill. The dispersing medium was removed from the obtained slurry.

Piezoelectric/electrostrictive elements were produced and the distortion factors $S_{4000}$ (ppm) and the piezoelectric constants $d_{31}$ were measured similarly to the experiment 1. TABLE 4 shows measurement results. According to the measurement results, as for samples that could be evaluated, good distortion factors $S_{4000}$ were obtained except for the samples 36 and 38, where in each of which the addition amount of Bi in terms of Bi atoms was "0" and also sample 40 in which a ratio "a" of the total number of atoms of A-site elements to the total number of atoms of B-site elements is equal to or lower than 1. As for the samples 37 and 39 in each of which the addition amount of $Bi_2O_3$ in terms of Bi atoms was equal to or greater than 0.2 molar part, the sintered bodies cracked and the piezoelectric/electrostrictive elements could not be evaluated.

<8 Experiment 5>

In experiment 5, $Bi_2O_3$ was added before calcination.

Further, in experiment 5, powders of $Li_2CO_3$, $C_6H_5O_6Na \cdot H_2O$, $C_6H_5O_6K$, $Nb_2O_5$ and $Ta_2O_5$ were weighed so as to provide a composition as shown in TABLE 5. In addition, powders of $Bi_2O_3$ were weighed so that an addition amount of the $Bi_2O_3$ in terms of Bi atoms are shown in TABLE 5 with respect to 100 molar parts of the perovskite oxide. Alcohol was added, as a dispersing medium, to the weighed powders of raw materials and the resultant powders were mixed and ground by a ball mill. TABLE 5 shows values of x, y, a and z of the general formula of $\{Li_y(Na_{1-x}K_x)_{1-y}\}_a(Nb_{1-z}Ta_z)O_3$, the addition amount of Bi in terms of Bi atoms, the distortion factor $S_{4000}$ and the piezoelectric constant $d_{31}$ for each of samples 54 and 55.

TABLE 5

| Sample | x | y | a | z | Addition amount in terms of Bi atoms (molar part) | $S_{4000}$ (ppm) | $d_{31}$ (pm/V) |
|---|---|---|---|---|---|---|---|
| 54* | 0.45 | 0.06 | 1.01 | 0.082 | 0.03 (added previously) | 415 | 40 |
| 55* | 0.45 | 0.06 | 1.01 | 0.082 | 0.10 (added previously) | X | X |

*Comparative Example

Next, similarly to experiment 1, the first calcination and the second calcination were carried out.

Alcohol was added, as a dispersing agent, to the powders calcined twice and the resultant powders were mixed and ground by the ball mill. The dispersing medium was removed from an obtained slurry.

Piezoelectric/electrostrictive elements were produced and the distortion factors $S_{4000}$ (ppm) and the piezoelectric constants $d_{31}$ were measured similarly to experiment 1. TABLE 5 shows the measurement results. According to the measurement results, if the $Bi_2O_3$ was added before the calcination, an improvement effect of the distortion factor $S_{4000}$ was not produced, as shown in sample 54. Furthermore, the sintered body cracked with a relatively small addition amount of $Bi_2O_3$ in terms of Bi atoms, as shown in sample 55 and the piezoelectric/electrostrictive elements could not be evaluated.

<9 Experiment 6>

In experiment 6, $Bi_2O_3$ was added before calcination.

Further, in experiment 6, powders of $Li_2CO_3$, $C_6H_5O_6Na \cdot H_2O$, $C_6H_5O_6K$, $Nb_2O_5$ and $Ta_2O_5$ were weighed so as to provide a composition as shown in TABLE 6. In addition, powders of $Bi_2O_3$ were weighed so that an addition amount of the $Bi_2O_3$ in terms of Bi atoms are shown in TABLE 6 with respect to 100 molar parts of the perovskite oxide. Alcohol was added, as a dispersing medium, to the weighed powders of raw materials and the resultant powders were mixed and ground by a ball mill.

TABLE 6

| Sample | x | y | a | z | Addition amount in terms of Mn atoms (molar part) | Addition amount in terms of Bi atoms (molar part) | $S_{4000}$ (ppm) | $d_{31}$ (pm/V) |
|---|---|---|---|---|---|---|---|---|
| 56* | 0.45 | 0.06 | 1.01 | 0.082 | 0.02 | 0.03 (added previously) | 535 | 38 |
| 57* | 0.45 | 0.06 | 1.01 | 0.082 | 0.02 | 0.10 (added previously) | X | X |

*Comparative Example

Next, similarly to experiment 1, the first calcination and the second calcination were carried out.

The powders were calcined twice and the powders of $MnO_2$ serving as an additive were weighed so that an addition amount of the $MnO_2$ in terms of Mn atoms are shown in TABLE 6 with respect to 100 molar parts of the perovskite oxide. Alcohol was added, as a dispersing medium, to the weighed powders of the perovskite oxide and the $MnO_2$ and the resultant powders were mixed and ground by a ball mill. The dispersing medium was removed from the obtained slurry. TABLE 6 shows values of x, y, a and z of the general formula of $\{Li_y(Na_{1-x}K_x)_{1-y}\}_a(Nb_{1-z}Ta_z)O_3$, the addition amount of Bi in terms of Bi atoms, the distortion factor $S_{4000}$ and the piezoelectric constant $d_{31}$ for each of samples 56 and 57.

Piezoelectric/electrostrictive elements were produced and the distortion factors $S_{4000}$ (ppm) and the piezoelectric constants $d_{31}$ were measured similarly to experiment 1. TABLE 6 shows the measurement results. According to the measurement results, if the $Bi_2O_3$ was added before calcination, an improvement effect of the distortion factor $S_{4000}$ was not produced as shown in sample 56. Furthermore, the sintered body cracked with a relatively small addition amount of $Bi_2O_3$ in terms of Bi atoms as shown in sample 57 and the piezoelectric/electrostrictive elements could not be evaluated.

While the invention has been shown and described in detail, the foregoing description is in all aspects illustrative and not restrictive. It is therefore understood that numerous modifications and variations can be devised without departing from the scope of the invention.

Moreover, as described in Japanese Patent Application Laid-Open No. 2005-281013, there is proposed a Bi and Mn in a (Li, Na, K)(Nb, Ta)$O_3$-based piezoelectric/electrostrictive composition so as to improve deliquescent properties and insulation properties of the (Li, Na, K)(Nb, Ta)$O_3$-based piezoelectric/electrostrictive composition.

However, the conventional (Li, Na, K)(Nb, Ta)$O_3$-based piezoelectric/electrostrictive composition has the problem of an insufficient field-induced distortion during the application of a high electric field, which is an important property for the use of the piezoelectric/electrostrictive actuator.

SUMMARY OF THE INVENTION

According to the present invention, a method of manufacturing a piezoelectric/electrostrictive ceramic composition includes the steps of: (a) synthesizing a perovskite oxide containing Li, Na and K as A-site elements and containing at least Nb out of the Nb and Ta as B-site elements, a ratio of total number of atoms of the A-site elements to total number of atoms of B-site elements being higher than 1; and (b) reacting the perovskite oxide synthesized in the step (a) with an additional material, wherein the additional material reacted with the perovskite oxide in the step (b) contains a Bi compound.

According to the present invention, a (Li, Na, K)(Nb, Ta)$O_3$-based piezoelectric/electrostrictive ceramic composition having a large field-induced distortion during application of a high electric field can be provided.

What is claimed is:

1. A method of manufacturing a piezoelectric/electrostrictive ceramic composition, comprising the steps of:
    (a) synthesizing a perovskite oxide containing Li, Na and K as A-site elements and containing at least Nb out of the Nb and Ta as B-site elements, a ratio of total number of atoms of the A-site elements to total number of atoms of the B-site elements being higher than 1; and
    (b) reacting the perovskite oxide synthesized in said step (a) with additional material,
    wherein the additional material reacted with the perovskite oxide in said step (b) contains a Bi compound.

2. The method of manufacturing a piezoelectric/electrostrictive ceramic composition according to claim 1, wherein an addition amount of the Bi compound with respect to 100 molar parts of the perovskite oxide is equal to or greater than 0.01 molar part and equal to or smaller than 0.1 molar part in terms of Bi atoms.

3. The method of manufacturing a piezoelectric/electrostrictive ceramic composition according to claim 1, wherein the additional material reacted with the perovskite oxide in said step (b) contains an Mn compound.

4. The method of manufacturing a piezoelectric/electrostrictive ceramic composition according to claim 3, wherein an addition amount of the Mn compound with respect to 100 molar parts of the perovskite oxide is equal to or greater than 0.01 molar part and equal to or smaller than 0.2 molar part in terms of Mn atoms.

* * * * *

UNITED STATES PATENT AND TRADEMARK OFFICE
CERTIFICATE OF CORRECTION

PATENT NO. : 8,119,023 B2
APPLICATION NO. : 12/399335
DATED : February 21, 2012
INVENTOR(S) : Tanaka et al.

It is certified that error appears in the above-identified patent and that said Letters Patent is hereby corrected as shown below:

Column 1

*After Line 29 and before Line 30*: please add -- Moreover, as described in Japanese Patent Application Laid-Open No. 2005-281013, there is proposed a Bi and Mn in a (Li, Na, K)(Nb, Ta)$O_3$-based piezoelectric/electrostrictive composition so as to improve deliquescent properties and insulation properties of the (Li, Na, K)(Nb, Ta)$O_3$-based piezoelectric/electrostrictive composition.

However, the conventional (Li, Na, K)(Nb, Ta)$O_3$-based piezoelectric/electrostrictive composition has the problem of an insufficient field-induced distortion during the application of a high electric field, which is an important property for the use of the piezoelectric/electrostrictive actuator.

SUMMARY OF THE INVENTION

According to the present invention, a method of manufacturing a piezoelectric/electrostrictive ceramic composition includes the steps of: (a) synthesizing a perovskite oxide containing Li, Na and K as A-site elements and containing at least Nb out of the Nb and Ta as B-site elements, a ratio of total number of atoms of the A-site elements to total number of atoms of B-site elements being higher than 1; and (b) reacting the perovskite oxide synthesized in the step (a) with an additional material, wherein the additional material reacted with the perovskite oxide in the step (b) contains a Bi compound.

According to the present invention, a (Li, Na, K)(Nb, Ta)$O_3$-based piezoelectric/electrostrictive ceramic composition having a large field-induced distortion during application of a high electric field can be provided. --

Column 15

*Lines 61-63*: please delete "Moreover, ... piezoelectric/electrostric-"

Signed and Sealed this
Eighth Day of May, 2012

David J. Kappos
*Director of the United States Patent and Trademark Office*

Column 16

*Lines 1-37*: please delete "tive composition ... can be provided."

*Line 47*: please add --an-- after "(a) with"